(12) United States Patent
Henderson et al.

(10) Patent No.: US 8,193,609 B2
(45) Date of Patent: Jun. 5, 2012

(54) HETEROJUNCTION BIPOLAR TRANSISTOR DEVICE WITH ELECTROSTATIC DISCHARGE RUGGEDNESS

(75) Inventors: Timothy Henderson, Portland, OR (US); Jeremy Middleton, Beaverton, OR (US); John Hitt, Plano, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 355 days.

(21) Appl. No.: 12/121,719

(22) Filed: May 15, 2008

(65) Prior Publication Data

US 2009/0283802 A1 Nov. 19, 2009

(51) Int. Cl.
*H01L 29/737* (2006.01)
(52) U.S. Cl. ........ 257/580; 257/164; 257/198; 257/582; 257/E29.191
(58) Field of Classification Search .................. 257/198, 257/580
See application file for complete search history.

(56) References Cited

U.S. PATENT DOCUMENTS

| | | | | |
|---|---|---|---|---|
| 5,598,015 A * | 1/1997 | Tanoue et al. | ................. | 257/197 |
| 6,043,520 A * | 3/2000 | Yamamoto et al. | ........... | 257/198 |
| 6,107,956 A * | 8/2000 | Russell et al. | .................. | 342/70 |
| 6,410,945 B1 * | 6/2002 | Shiota et al. | ................... | 257/191 |
| 6,611,008 B2 * | 8/2003 | Twynam et al. | ............... | 257/197 |
| 7,256,434 B2 * | 8/2007 | Ohbu et al. | ........... | 257/200 |
| 2002/0053683 A1 * | 5/2002 | Hill et al. | ...................... | 257/197 |
| 2002/0153536 A1 * | 10/2002 | Hirata et al. | .................. | 257/197 |
| 2003/0222278 A1 * | 12/2003 | Liu et al. | ......................... | 257/197 |
| 2005/0156194 A1 * | 7/2005 | Ohbu et al. | ................... | 257/197 |
| 2006/0001044 A1 * | 1/2006 | Yamada et al. | ............... | 257/197 |
| 2006/0138459 A1 * | 6/2006 | Kurokawa et al. | ........... | 257/197 |
| 2006/0284282 A1 * | 12/2006 | Cunningham | ................ | 257/565 |
| 2007/0223158 A1 * | 9/2007 | Ma et al. | ......................... | 361/56 |

* cited by examiner

*Primary Examiner* — Nathan W. Ha
*Assistant Examiner* — Abul Kalam
(74) *Attorney, Agent, or Firm* — Schwabe Williamson & Wyatt

(57) ABSTRACT

A heterojunction bipolar transistor (HBT) device and system having electrostatic discharge ruggedness, and methods for making the same, are disclosed. An HBT device having electrostatic discharge ruggedness may include one or more emitter fingers including an emitter layer, a transition layer formed over the emitter layer, and an emitter cap layer formed over the transition layer.

12 Claims, 6 Drawing Sheets

HETEROJUNCTION BIPOLAR TRANSISTOR DEVICE WITH ELECTROSTATIC DISCHARGE RUGGEDNESS

TECHNICAL FIELD

Embodiments of the present invention relate generally to microelectronic devices including heterojunction bipolar transistor devices having electrostatic discharge ruggedness.

BACKGROUND

Electrostatic discharge (ESD) is known to be capable of causing catastrophic damage to microelectronic devices. Damage may include, for example, thermal damage and breakdown. Even where total failure is avoided, an ESD event may nevertheless lead to degraded performance.

The susceptibility of microelectronic devices to failure resulting from ESD events has led to the emergence of various protective features designed specifically to protect microelectronic devices from such failure. In some cases, to ensure ESD survivability of devices, ESD protection circuitry has been included with the device. This circuitry may include, for example, diode strings or other structures. Although these structures may be capable of providing the desired ESD protection to the device, they also take up valuable space on a chip, driving up cost and sometimes leading to unwanted capacitance that can degrade performance.

In certain devices such as aluminum gallium arsenide (AlGaAs)/gallium arsenide (GaAs) heterojunction bipolar transistor (HBT) devices, thick AlGaAs emitter layers have been found to provide some ESD protection. Unfortunately, however, AlGaAs emitter HBTs are also known to suffer inferior electrical characteristics, such as inferior gain versus temperature characteristics.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

Figure 1:
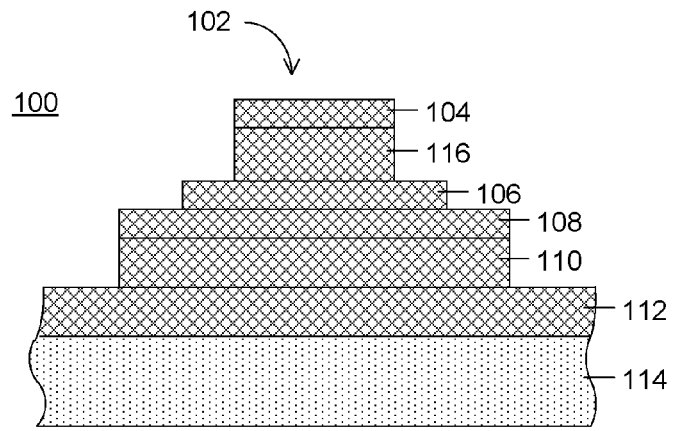
FIG. 1 illustrates a heterojunction bipolar junction transistor device in accordance with various embodiments of the present invention.

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

The terms "coupled to," along with its derivatives, may be used herein. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

The phrase "formed over," along with its derivatives, may be used herein. "Formed over" in the context of a layer being "formed over" another layer may mean that a layer is formed above, but not necessarily in direct physical or electrical contact with, another layer (e.g., there may be one or more other layers interposing the layers). In some embodiments, however, "formed over" may mean that a layer is in direct physical contact with at least a portion of a top surface of another layer.

For the purposes of the present invention, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element.

Various embodiments of the present invention are directed to bipolar junction transistor (HBT) devices including a transition layer between an emitter layer and an emitter contact layer. HBT devices including the transition layer may allow an HBT unit cell to survive an electrical stress event such as, for example, an electrostatic discharge (ESD) event, by effectively clamping the total current that can pass through the unit cell. Clamping the total current passing through a unit cell may allow for additional unit cells to reach the breakdown voltage, allowing the additional unit cells to contribute current carrying capability to the HBT device.

An exemplary HBT device 100 is illustrated in FIG. 1. In various embodiments, HBT device 100 is an indium gallium phosphide (InGaP)/gallium arsenide (GaAs) HBT device. HBT device 100 includes at least one emitter finger 102. As described herein, a "unit cell" may comprise one or more emitter fingers such as, for example, emitter finger 102. Emitter finger 102 may include an emitter cap layer 104 and an emitter layer 106, and emitter finger 102 may be on top of a base layer 108, a collector layer 110, and a subcollector 112 over a substrate 114.

A transition layer 116 may be formed between emitter layer 106 and emitter cap layer 104. Transition layer 116 may have one or more characteristics suitable for protecting HBT device 100 from damage arising from an ESD event (e.g., a current spike). For example, transition layer 116 may have low series resistance and low saturation current relative to various related art devices. In various embodiments, the advantageous characteristic(s) of transition layer 116 may result in a minimal amount of parasitic emitter resistance while at the same time clamping an amount of current that can pass through any particular unit cell of HBT device 100.

In various embodiments, clamping of the amount of current passing through individual unit cells of HBT device 100 may allow scalability of current carrying capability with the number of unit cells of HBT device 100. In other words, the multiple unit cells each contribute to the carrying of the current resulting from an ESD event so that no individual unit cell (or some other subset of the total unit cells of HBT device 100) carries the entire current alone. As a result, during an ESD event, once the current in a unit cell is clamped, the voltage across all unit cells rises, allowing the unit cells to reach breakdown and then snap back, allowing the total current to be shared among the unit cells as opposed to a single unit cell carrying the current alone.

Figure 2:
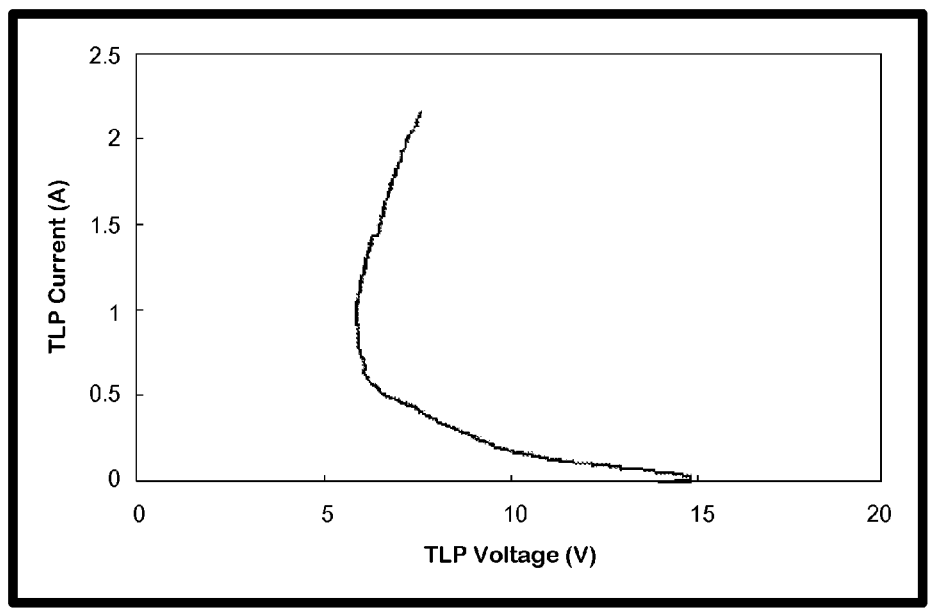
FIG. 2 is a transmission line pulse measurement simulating an electrostatic discharge event on a related art single-unit cell heterojunction bipolar junction transistor device.
Figure 3:
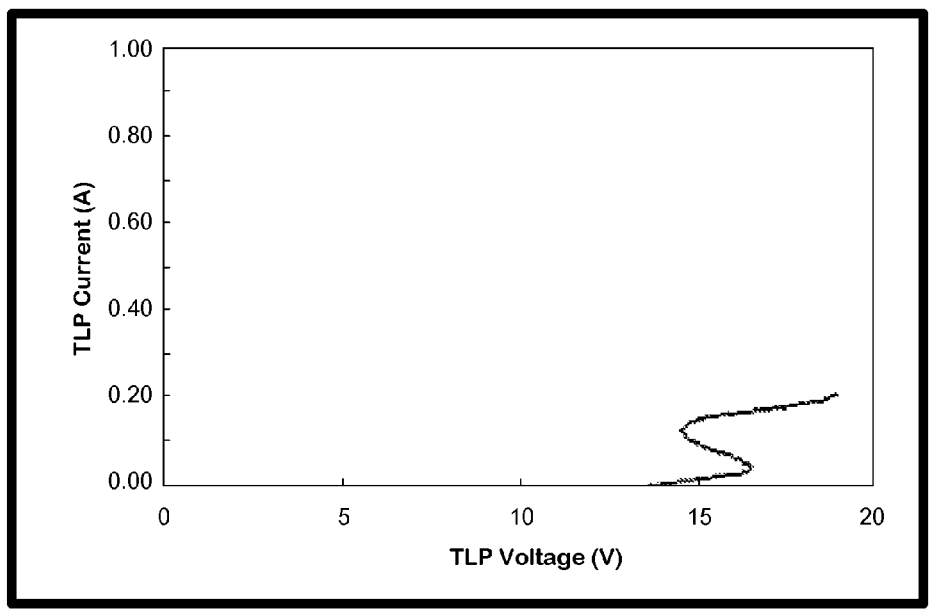
FIG. 3 is a transmission line pulse measurement simulating an electrostatic discharge event on a single-unit cell heterojunction bipolar junction transistor device in accordance with various embodiments of the present invention.
Figure 4:
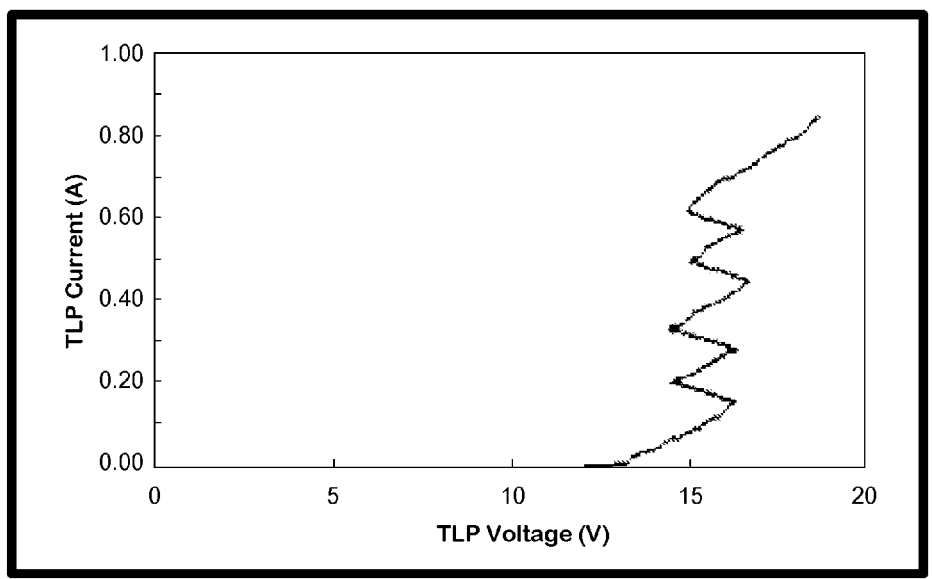
FIG. 4 is a transmission line pulse measurement simulating an electrostatic discharge event on a multi-unit cell heterojunction bipolar junction transistor device in accordance with various embodiments of the present invention.

The clamping characteristic of HBT device 100 may be understood more clearly with reference to FIGS. 2-4. FIGS. 2-4 illustrate transmission line pulse measurements simulating an ESD event for a related art multi-unit cell HBT device (FIG. 2), an embodiment of a single-unit cell HBT device in accordance with the present invention (FIG. 3), and an embodiment of a multi-unit cell HBT device in accordance with the present invention (FIG. 4).

As illustrated in FIG. 2, a single cell of a related art multi-unit cell HBT device will carry all or most of the current in an ESD pulse, which may result in localized failure. As normally occurs, the voltage across that unit cell increases until it reaches breakdown (i.e., the triggering event). On reaching the breakdown voltage, that unit cell begins to carry current and the voltage decreases as it should except that the current continues to increase, which may prevent one or more other unit cells of the HBT device from reaching the breakdown voltage. Effectively, the total current that can be carried by a multi-unit cell HBT device is not scalable with the number of unit cells because the first unit cell (or some subset of all unit cells of HBT device) carries all or most of the current of the ESD pulse.

In contrast, embodiments of the present invention may be configured to clamp the total current that can pass through an individual emitter finger, and thus a unit cell, of an HBT device. FIG. 3 and FIG. 4 illustrate embodiments of a single-unit cell (FIG. 3) and multi-unit cell (FIG. 4) HBT devices in accordance with embodiments of the present invention, the HBT devices including a transition layer (such as, e.g., transition layer 116 of FIG. 1) for clamping the total current that can pass through a unit cell.

As illustrated in FIG. 3, the voltage across the unit cell increases until it reaches breakdown, and on reaching the breakdown voltage, the voltage snaps back and the unit cell begins to carry current. In contrast to the situation illustrated in FIG. 2, however, the current is clamped (as illustrated, to about 0.20 amps (A)). Accordingly, the voltage across the cell rises.

For a multi-unit cell as illustrated in FIG. 4, the voltage is seen by all unit cells (four, in this case) in parallel, allowing the additional unit cells to reach breakdown and snap back to contribute current carrying capability to the HBT device. Therefore, it may be feasible that the total current sustainable by a multi-unit cell HBT device is scalable with the number of unit cells of the HBT device, as opposed to being limited to the current carrying capability of a single unit cell.

An exemplary method for forming an HBT device, such as, for example, HBT device 100, is illustrated in FIGS. 5-14 by way of cross-sectional side views of the HBT device at various stages of the method. It should be noted that various operations discussed and/or illustrated may be generally referred to as multiple discrete operations in turn to help in understanding embodiments of the present invention. The order of description should not be construed to imply that these operations are order dependent, unless explicitly stated. Moreover, some embodiments may include more or fewer operations than may be described.

Exemplary materials, thicknesses, doping concentrations, and dopants for forming the HBT device described with reference to FIGS. 5-14 are described in Table 1. It should be noted that HBT devices within the scope of the invention are not limited to having every characteristic described therein, but may instead have some subset of characteristics described, unless otherwise indicated.

TABLE 1

| Layer | Composition | Approximate Thickness | Approximate Doping Concentration | Dopant |
|---|---|---|---|---|
| Emitter Cap 504 | $In_yGa_{1-y}As$ (y = 0.50) | 300A ± 10% | $2.0 \times 10^{19}$ cm$^{-3}$ | Si or Te |
| Emitter Cap Grading | $In_yGa_{1-y}As$ (y = 0 to 0.5) | 300A ± 10% | $2.0 \times 10^{19}$ cm$^{-3}$ | Si or Te |
| Transition 516 | $Al_yGa_{1-y}As$ (y = 0.3) | 2200A ± 10% | $3.0 \times 10^{17}$ cm$^{-3}$ | Si |
| Emitter 506 | $In_{1-y}Ga_yP$ (y = 0.5) | 350A ± 10% | $1.0 \pm 0.1 \times 10^{17}$ cm$^{-3}$ | Si |
| Base 508 | GaAs | 650A ± 10% | $4.0 \pm 0.4 \times 10^{19}$ cm$^{-3}$ | C |
| Collector 510 | GaAs | 6500A ± 5% | $7.0 \pm 0.7 \times 10^{15}$ cm$^{-3}$ | Si |
| Collector Grading | GaAs | 2000A ± 5% | $1.0 \pm 0.1 \times 10^{17}$ cm$^{-3}$ | Si |
| Subcollector 512 | GaAs | 12000A ± 5% | $5.0 \pm 0.5 \times 10^{18}$ cm$^{-3}$ | Si |

Figure 5:
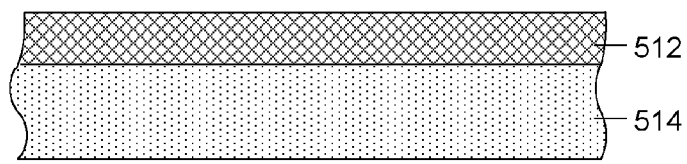
FIGS. 5-13 illustrate various stages of a method for forming a heterojunction bipolar transistor device structure in accordance with various embodiments of the present invention.

As illustrated in FIG. 5, a subcollector layer 512 may be formed over substrate 514. Although various materials may be equally suitable, in exemplary embodiments subcollector layer 512 may comprise GaAs. Substrate 514 may comprise any substrate known in the art. For example, substrate 514 may comprise, in various embodiments, gallium arsenide (GaAs). In other embodiments, however, substrate 514 may comprise gallium nitride (GaN), indium phosphide (InP), or another material or combination of materials suitable for the application.

Figure 6:
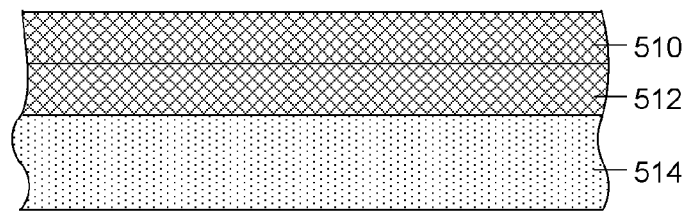
Figure 7:
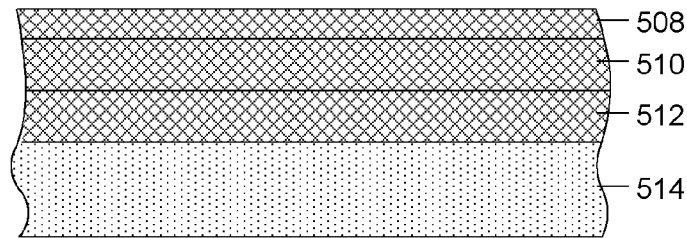

A collector layer 510 may be formed over subcollector layer 512, as illustrated in FIG. 6, and a base layer 508 may be formed over collector layer 510, as illustrated in FIG. 7. Although various materials may be equally suitable, in exemplary embodiments collector layer 510 and/or base layer 508 may comprise GaAs. In various embodiments, a collector grading layer (not illustrated; refer to Table 1) may be included between collector layer 510 and subcollector layer 512 to provide an energy transition region therebetween. In some embodiments, the collector grading layer may be omitted altogether.

Figure 8:
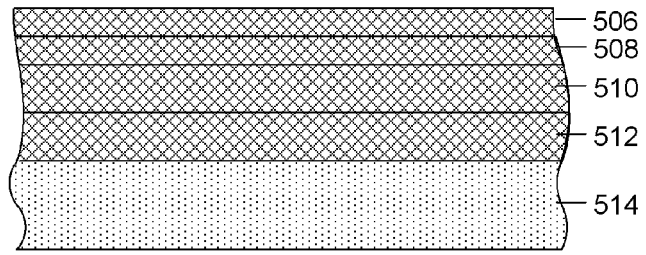

An emitter layer 506 may be formed over base layer 508, as illustrated in FIG. 8. Although various materials may be equally suitable, in exemplary embodiments emitter layer 506 may comprise indium gallium phosphide (InGaP). In other embodiments, emitter layer 506 may comprise aluminum gallium arsenide (AlGaAs) or another suitable material.

Figure 9:
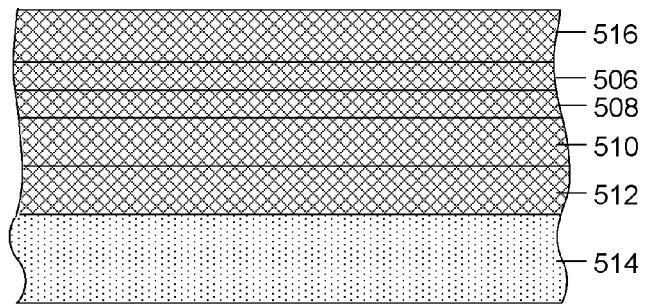

Turning now to FIG. 9, a transition layer 516 may be formed over emitter layer 506, and may be adapted to provide the current clamping capability to the HBT device as described more fully herein. In general, transition layer 516 may comprise any material suitable for clamping the total current capable of passing through an emitter finger of an HBT device. AlGaAs has been found to provide the desired clamping effect. In various ones of these embodiments, transition layer 516 comprises an AlGaAs material having a doping concentration and/or dopant adapted to provide a suitable saturation current. For instance, the doping concentration and/or dopant may be selected to provide a saturation current low enough to ensure survivability of an emitter finger/unit cell but high enough to sustain normal operation of the HBT device. Similarly, transition layer 516 may be formed with a thickness adapted to sustain a high enough electric field to trigger snapping back in other unit cells as described herein with reference to FIG. 3 and FIG. 4.

Figure 10:
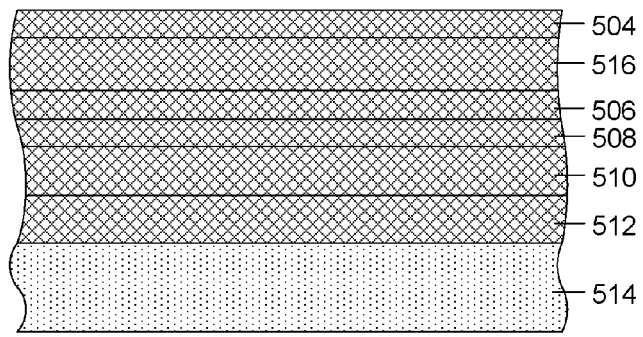

An emitter cap layer 504 may be formed over transition layer 516, as illustrated in FIG. 10. Although various materials may be equally suitable, in exemplary embodiments emitter cap layer 504 may comprise indium gallium arsenide (InGaAs). In various embodiments, an emitter cap grading layer (not illustrated; refer to Table 1) may be included between emitter cap layer 504 and transition layer 516 to provide a smooth conduction band transition region therebetween. In some embodiments, the emitter cap grading layer may be omitted altogether.

Now that the HBT epitaxial structure is formed (i.e., subcollector layer 512, collector layer 510, base layer 508, emitter layer 506, transition layer 516, and emitter cap layer 504) subsequent operations may be performed for fully forming the desired HBT device.

Figure 11:
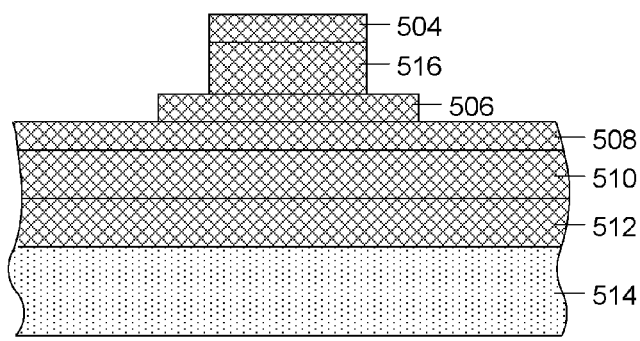
Figure 12:
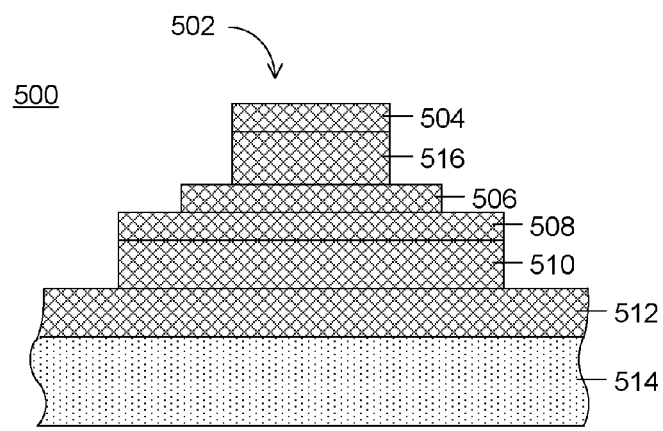

As illustrated in FIG. 11, for example, portions of emitter cap layer 504, transition layer 516, and emitter layer 506 may be etched down to base layer 508 resulting in the emitter mesa structure illustrated, and thereby forming, in substantial part, emitter finger 502. Then, as illustrated in FIG. 12, portions of base layer 508 and collector layer 510 may be etched down to subcollector layer 512 resulting in the base mesa structure illustrated.

In various embodiments, one or more emitter fingers in addition to emitter finger 502 may be formed using the same, or different, method used for forming emitter finger 502. In the typical case, all emitter fingers are formed substantially simultaneously through the same etching operation(s).

Figure 13:
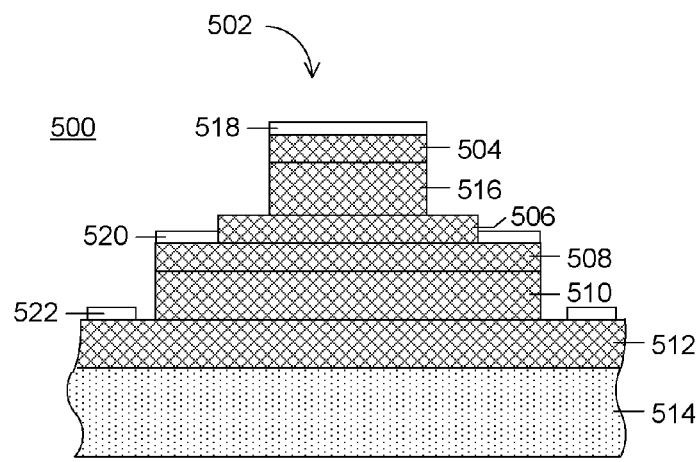

The resulting emitter finger 502 may then be metallized for electrically interconnecting the HBT device 500 to other devices. As illustrated in FIG. 13, for example, HBT device 500 may include an emitter contact 518 formed over emitter cap layer 504, base contacts 520 formed over base layer 508, and collector contacts 522 formed over subcollector layer 512. Emitter contact 518, base contacts 520, and collector contacts 522 may comprise any material suitable for electrically interconnecting HBT device 500 including, for example, a suitable metal.

Embodiments of HBT devices disclosed herein may be incorporated into various apparatuses and systems, including those operating at microwave and/or millimeter wave frequencies. For example, in various embodiments, an HBT device including a transition layer adapted to provide ESD protection may be included in switches, various logic devices, control circuitry, or may be used as an amplifier stage.

Figure 14:
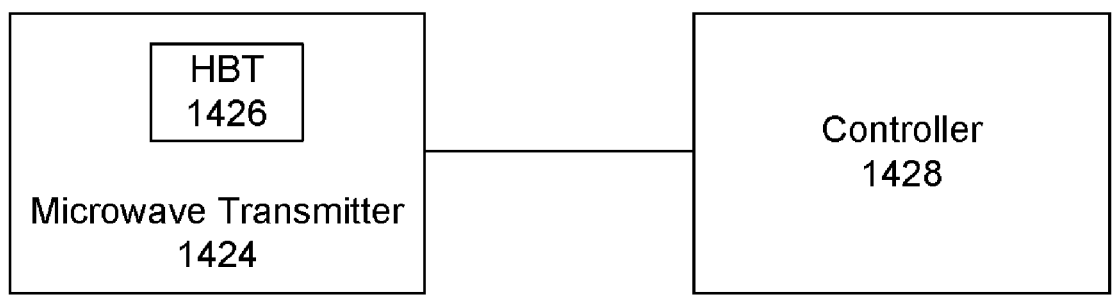
FIG. 14 illustrates a block diagram of a system incorporating a heterojunction bipolar transistor device structure in accordance with various embodiments of the present invention.

A block diagram of an exemplary system 1400 is illustrated in FIG. 14. As illustrated, system 1400 incorporating a microwave transmitter 1424 including at least one HBT device 1426 including a transition layer adapted to provide ESD protection such as, for example, HBT device 500 described above.

System 1400 may be any system used for power amplification at microwave and/or millimeter wave frequencies. For example, system 1400 may be suitable for any one or more of terrestrial and satellite communications, radar systems, and possibly in various industrial and medical applications. Radar applications may include military-use radar, air traffic control, navigation, and the like.

In various embodiments, system 1400 may be a selected one of a radar device, a satellite communication device, a mobile handset, or a cellular telephone base station. System 1400 may find applicability in other applications in which power amplification for microwave and/or millimeter wave frequency transmission and/or reception is desired.

In various embodiments, microwave transmitter 1424 may be configured to transmit signals on microwave and/or millimeter wave frequencies. System 1400 may further comprise a receiver configured to receive signals on microwave and/or millimeter wave frequencies. In some embodiments, microwave transmitter 1424 and a receiver may be a transceiver.

System 1400 may include one or more antennas (not illustrated) coupled to microwave transmitter 1424. One or more of the antennas may be configured to transmit and/or receive electromagnetic radiation at frequencies suitable for the particular application.

A controller 1428 may be coupled to microwave transmitter 1424. Controller 1428 may be configured to control operation of microwave transmitter 1424 and/or a receiver when included. In various embodiments, controller 1428 may be configured to produce and distribute a clock by which system 1400 is synchronized. In embodiments wherein system 1400 is configured to both transmit and receive microwave and/or millimeter wave frequencies, controller 1428 may be configured to control switching between transmit and receive modes, which may occur by way of a duplexer. Additionally or alternatively, controller 1428 may be configured to control various other aspects of system 1400.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A heterojunction bipolar transistor (HBT) device comprising:
   a subcollector layer;
   a collector layer formed over the subcollector layer;
   a base layer formed over the collector layer;
   an emitter layer including indium gallium phosphide formed over the base layer;
   a transition layer including aluminum gallium arsenide formed directly on the emitter layer such that the aluminum gallium arsenide is in direct contact with the indium gallium phosphide of the emitter layer; and
   an emitter cap layer including indium gallium arsenide formed directly on the transition layer such that the indium gallium arsenide is in direct contact with the aluminum gallium arsenide of the transition layer;
   wherein the emitter layer, the transition layer, and the emitter cap layer form, at least in part, an emitter finger, and wherein the transition layer is configured to clamp an amount of current flowing through the emitter finger.

2. The device of claim 1, wherein the transition layer comprises doped aluminum gallium arsenide.

3. The device of claim 1, wherein the device further comprises another emitter finger including another emitter layer, another transition layer formed over the other emitter layer, and another emitter cap layer formed directly on the other transition layer.

4. The device of claim 1, wherein the device forms, at least in part, an amplifier stage.

5. The device of claim 1, wherein the device is a selected one of a switch, a logic device, or control circuitry.

6. A method for forming a heterojunction bipolar transistor (HBT) device, comprising:
   forming a collector layer over a subcollector layer;
   forming a base layer over the collector layer;
   forming an emitter layer including indium gallium phosphide over the base layer;
   forming a transition layer including aluminum gallium arsenide directly on the emitter layer such that the aluminum gallium arsenide is in direct contact with the indium gallium phosphide of the emitter layer; and
   forming an emitter cap layer including indium gallium arsenide directly on the transition layer such that the indium gallium arsenide is in direct contact with the transition layer,
   wherein said forming of the emitter layer, the transition layer, and the emitter cap layer are performed to form, at least in part, an emitter finger, and wherein the transition layer is configured to clamp an amount of current flowing through the emitter finger.

7. The method of claim 6, wherein said forming of the transition layer comprises forming a layer of doped aluminum gallium arsenide over the emitter layer.

8. The method of claim 6, wherein said forming of the emitter layer comprises forming the emitter layer directly on the base layer such that the indium gallium phosphide is in direct contact with the base layer.

9. The method of claim 6, further comprising forming another emitter finger.

10. A system comprising:
    a transmitter including a heterojunction bipolar transistor (HBT) device including:
       a subcollector layer;
       a collector layer formed over the subcollector layer;
       a base layer formed over the collector layer;
       an emitter layer including indium gallium phosphide formed over the base layer;
       a transition layer including aluminum gallium arsenide formed directly on the emitter layer such that the aluminum gallium arsenide is in direct contact with the indium gallium phosphide of the emitter layer; and
       an emitter cap layer including indium gallium arsenide formed directly on the transition layer such that the indium gallium arsenide is in direct contact with the transition layer;
       wherein the emitter layer, the transition layer, and the emitter cap layer form, at least in part, an emitter finger, and wherein the transition layer is configured to clamp an amount of current flowing through the emitter finger; and
    a controller configured to control operation of the transmitter.

11. The system of claim 10, wherein the system is a selected one of a radar device, a satellite communication device, a mobile handset, and a base station.

12. The system of claim 10, further comprising a receiver, and wherein the controller is further configured to control operation of the receiver.

* * * * *